United States Patent [19]
Jeng et al.

[11] Patent Number: 5,834,359
[45] Date of Patent: Nov. 10, 1998

[54] METHOD OF FORMING AN ISOLATION REGION IN A SEMICONDUCTOR SUBSTRATE

[75] Inventors: Erik S. Jeng, Taipei; Fu-Liang Yang, Tainan, both of Taiwan

[73] Assignee: Vanguard International Semiconductor Corporation, Hsinchu, Taiwan

[21] Appl. No.: 924,710

[22] Filed: Aug. 29, 1997

[51] Int. Cl.⁶ .................................................... H01L 21/76
[52] U.S. Cl. .................. 438/425; 438/427; 438/444; 438/445; 148/DIG. 50
[58] Field of Search ................................ 438/425, 426, 438/424, 427, 444, 445; 148/DIG. 50

[56] References Cited

U.S. PATENT DOCUMENTS

| | | |
|---|---|---|
| 4,842,675 | 6/1989 | Chapman et al. . |
| 5,470,783 | 11/1995 | Chiu et al. . |
| 5,498,566 | 3/1996 | Lee . |
| 5,679,602 | 10/1997 | Lie et al. . |
| 5,731,221 | 3/1998 | Kwon . |

*Primary Examiner*—Trung Dang
*Attorney, Agent, or Firm*—Christensen, O'Connor, Johnson & Kindness PLLC

[57] ABSTRACT

A method for forming an isolation region in a semiconductor substrate is disclosed. The present invention includes forming an insulating layer on the semiconductor substrate, and then forming a dielectric layer on the insulating layer. After patterning to etch portions of the dielectric layer, the insulating layer and the semiconductor substrate are etched using the patterned dielectric layer as a mask, thereby forming a trench in the semiconductor substrate. Next, a first silicon oxide layer is formed over the semiconductor substrate, and the first silicon oxide layer is then anisotropically etched to form a spacer on the sidewalls of the trench. Thereafter, the semiconductor substrate is thermally oxidized to form a field oxide region over the semiconductor substrate, and a second silicon oxide layer is then formed over the field oxide region. Finally, the second silicon oxide layer is etched back until surface of the dielectric layer is exposed.

16 Claims, 4 Drawing Sheets

METHOD OF FORMING AN ISOLATION REGION IN A SEMICONDUCTOR SUBSTRATE

TECHNICAL FIELD OF THE INVENTION

The present invention relates to a method of forming an isolation region, and more particularly, to a method of forming an isolation region in a semiconductor substrate using shallow trench and LOCOS technology.

BACKGROUND OF THE INVENTION

The art of isolating devices that are built on a semiconductor substrate is an important aspect of modern metal-oxide-semiconductor (MOS) and bipolar integrated circuit technology. Improper isolation among transistors will cause current leakages, which can consume a significant amount of power. In addition, improper isolation can further escalate latchup that may damage the circuit function momentarily or permanently. Still further, improper isolation can result in noise margin degradation, voltage shift or crosstalk. In complementary MOS (CMOS) technology, adequate isolation provided between opposite-type transistors is important, as well as between same-type transistors.

In MOS technology, isolation is usually achieved by forming isolation regions between neighboring active regions. Typically, an isolation region is formed by ion-doping a channel stop of polarity opposite to the source and drain electrode of the integrated circuit device, and growing a thick oxide, often referred to as a field oxide (FOX). The channel stop and the FOX cause the threshold voltage in the isolation region to be much higher than that of the neighboring active devices, making surface inversion unlikely to occur under the field oxide region.

The conventional LOCOS (LOCal Oxidation of Silicon) process is used to develop regions which laterally isolate the active devices on the integrated circuits. The LOCOS structure is typically formed by using a patterned silicon nitride layer together with a pad oxide below, which is utilized to release stress caused by the silicon nitride layer, to mask the active regions, followed by ion-implantation in the isolation region and then locally growing a thick field oxide.

The structure mentioned above possesses some inherent drawbacks resulting from the processes. Among the drawbacks is lateral oxidation of the silicon underneath the silicon nitride mask, which makes the edge of the field oxide resemble a bird's beak. Lateral diffusion of channel-stop dopants makes the dopants encroach into the active device regions. Both effects overtake the active device regions, making the physical channel width less than the desired channel width. The reduced portion overtaken by both effects will make the situation even worse when devices are scaled down for very large scale integration (VLSI) implementation, thus increasing threshold voltage and reducing the current driving capability.

FIGS. 1A and 1B show cross-sectional views illustrating another isolation technique, which is usually referred to as shallow trench isolation (STI) in the prior art. Shallow trenches 12A or 12B are firstly formed between active areas in a semiconductor substrate 10, followed by blanket deposition of a thick silicon oxide layer 14. After annealing this silicon oxide layer 14, an etch back or a chemical-mechanical polishing (CMP) is performed over the silicon oxide layer 14. Unfortunately, due to a "dishing" effect, the resultant surface of the silicon oxide layer 14 is not flat especially over the wide shallow trench 12B as shown in FIG 1B, and therefore an additional planarization step is required.

SUMMARY OF THE INVENTION

In accordance with the present invention, a method for forming an isolation region in a semiconductor substrate is disclosed. The present invention includes forming an insulating layer on the semiconductor substrate, and then forming a dielectric layer on the insulating layer. After patterning to etch portions of the dielectric layer, the insulating layer and the semiconductor substrate are etched using the patterned dielectric layer as a mask, thereby forming a trench in the semiconductor substrate. Next, a first silicon oxide layer is formed over the semiconductor substrate, and the first silicon oxide layer is then anisotropically etched to form a spacer on the sidewalls of the trench. Thereafter, the semiconductor substrate is thermally oxidized to form a field oxide region over the semiconductor substrate, and a second silicon oxide layer is then formed over the field oxide region. Finally, the second silicon oxide layer is etched back until surface of the dielectric layer is exposed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 2:
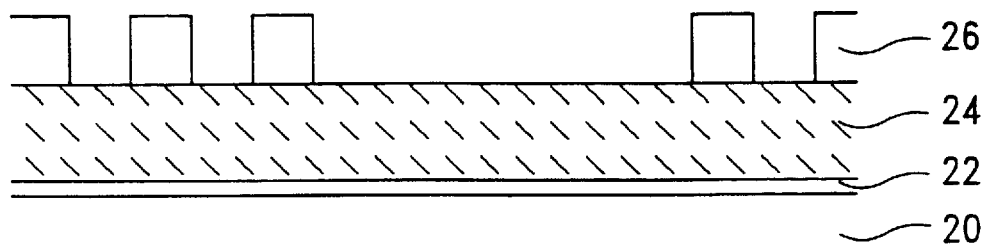
FIGS. 2–10 show cross-sectional views illustrative of various stages in the fabrication of an isolation region in accordance with the present invention.
Figure 9:
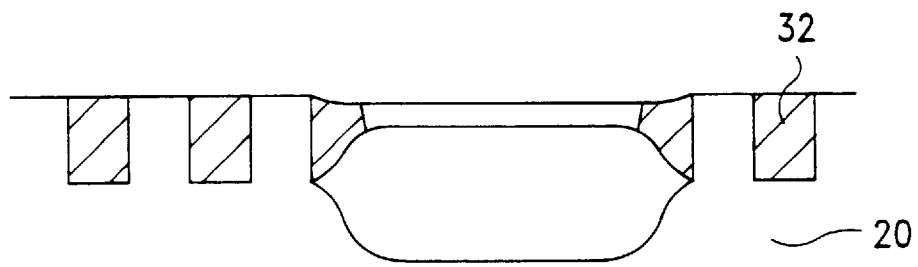

Referring to FIG. 2, an insulating layer 22 such as a silicon oxide layer is formed on a semiconductor substrate 20. In this embodiment, this silicon oxide layer 22 is preferably formed by a conventional oxidation method, so that the etch rate of this silicon oxide layer 22 is larger than that of a chemical vapor deposited oxide, wherein the advantage of having a large etch rate will become apparent after an etch step in connection with FIG. 9 is described. Next, a dielectric layer 24 is formed on the silicon layer 22. In this embodiment, silicon nitride is used as the material for the dielectric layer 24, which is deposited using conventional low pressure chemical vapor deposition (LPCVD) or plasma-enhanced chemical vapor deposition (PECVD). Other materials such as silicon oxide may be alternatively used by a plasma-enhanced chemical vapor deposition (PECVD).

Figure 3:
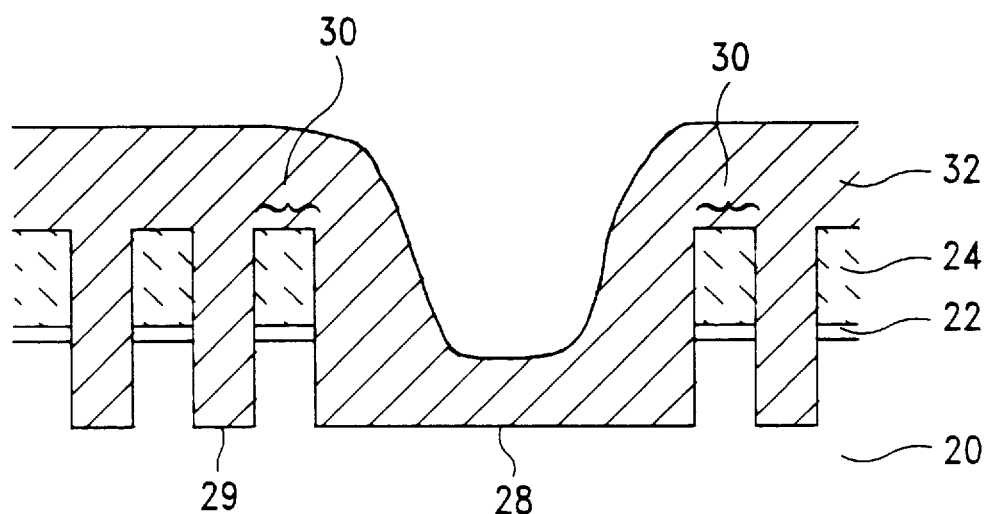

Conventional photolithography techniques are applied to define active areas in a photoresist layer 26 formed on the dielectric layer 24. The photoresist layer 26 is then used as a mask to anisotropically etch the dielectric layer 24 as shown in FIG. 3. After the photoresist layer 26 is stripped, the etched dielectric layer 24 is further used as a mask to etch the silicon oxide layer 22 and the substrate 20, thereby forming shallow trenches 28 or 29 between active areas 30. It is observed in this diagram that the trench 28 is formed in a relatively open isolation area, and the trench 29 is formed in a relatively dense isolation area.

Figure 4:
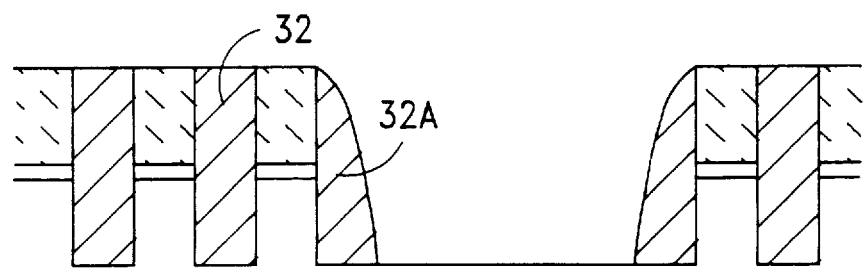

Still referring to FIG. 3, a silicon oxide layer 32 is deposited over the dielectric layer 24 and the exposed substrate 20, for example, by a chemical vapor deposition (CVD) method. The silicon oxide layer 32 is then anisotropically etched back to form spacers 32A on the sidewalls of the trench 28 in the open isolation area as shown in FIG. 4.

Figure 5:
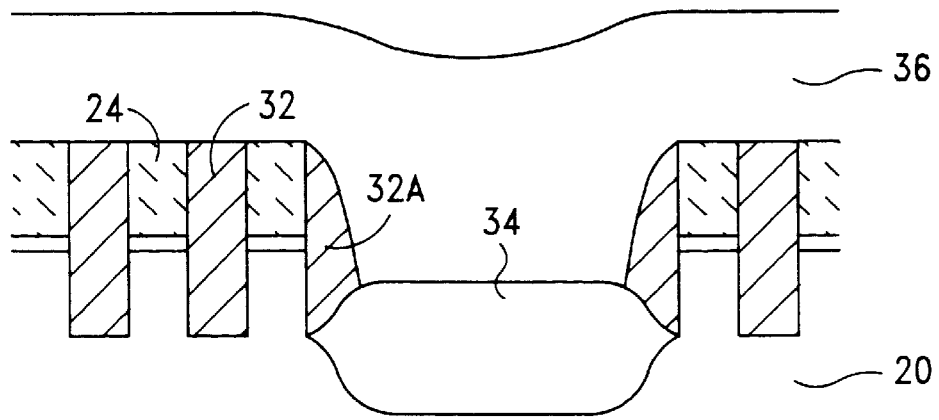

Referring to FIG. 5, a field oxide 34 is grown on and in the exposed substrate 20 in the open isolation area. It is observed that the lateral encroachment of the field oxide 34 is substantially reduced due to the oxide spacers 32A. Further, it is noted that the silicon oxide layer 32 and the spacers 32A are simultaneously annealed (or densified) during the field oxide growing, thereby reducing the thermal budget.

Figure 1A:
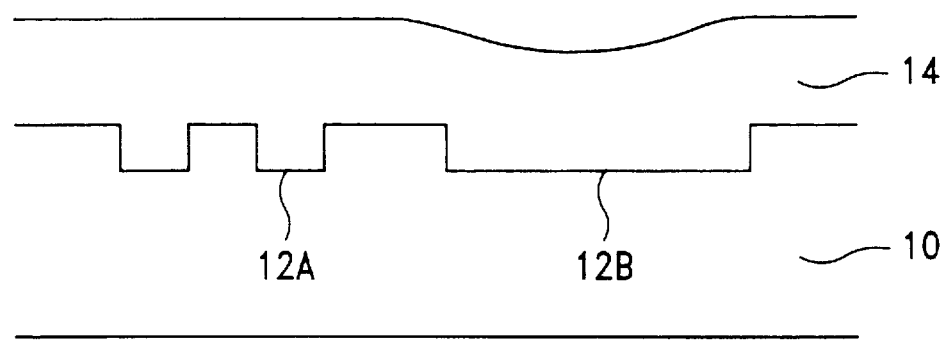
FIGS. 1A and 1B show cross-sectional views illustrating a conventional isolation technique.
Figure 1B:
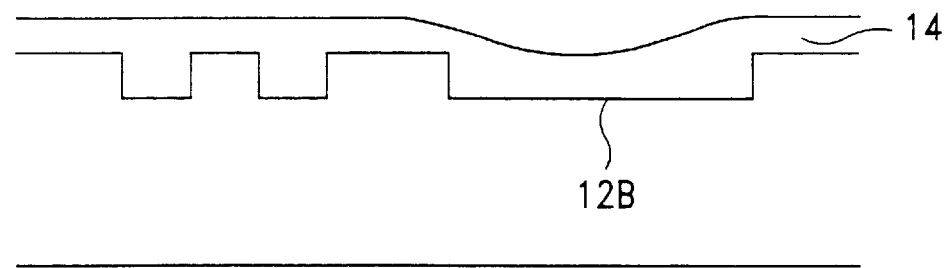
Figure 6:
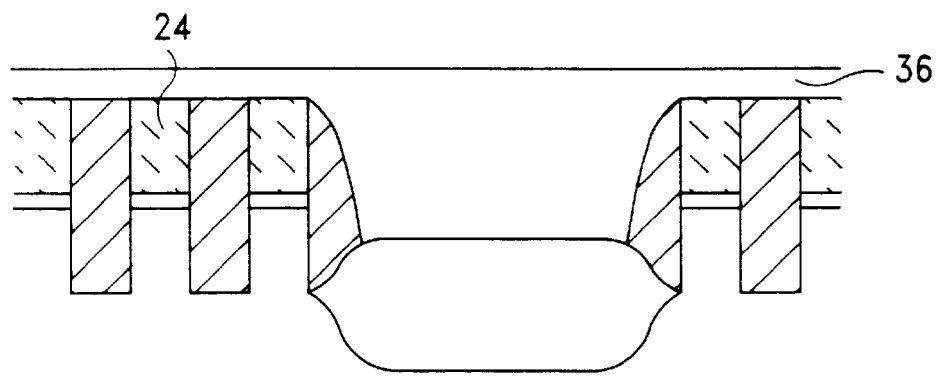
Figure 7:
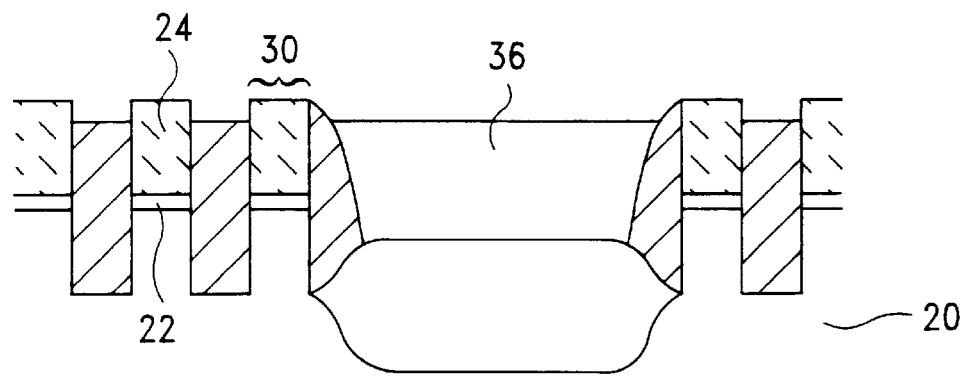

A thick silicon oxide layer 36 is then deposited over the field oxide 34, the silicon oxide layer 32, the spacers 32A, and the dielectric layer 24. Thereafter, a conventional etch back process or a chemical-mechanical polishing (CMP) is performed to etch a portion of the silicon oxide layer 36 until a suitable height, about 50 angstroms in this embodiment, above the surface of the dielectric layer 24 is reached, resulting in the structure shown in FIG. 6. A further etch process, such as a plasma oxide etch, is employed to etch the silicon oxide layer 36 until the surface of the dielectric layer 24 is exposed, where the dielectric layer 24 is used to facilitate etch end point detecting. The resultant structure is shown in FIG. 7. It is observed that the dishing effect (see FIG. 1B) is substantially improved, in that a near flat surface is obtained for the silicon oxide 36 in the open isolation area.

Figure 8:
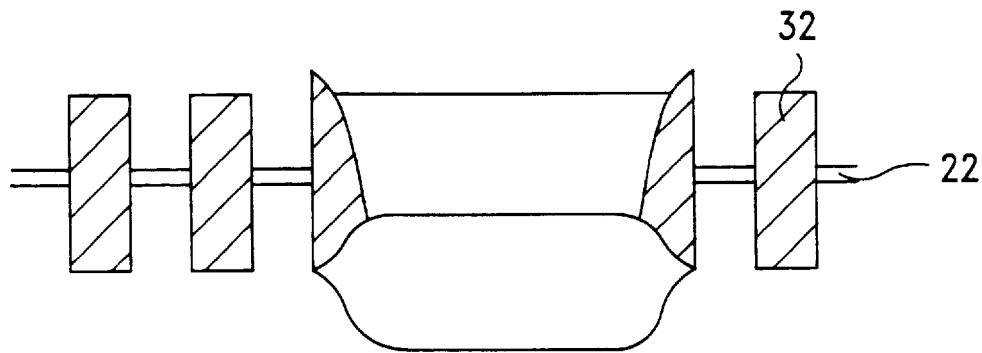
Figure 10:
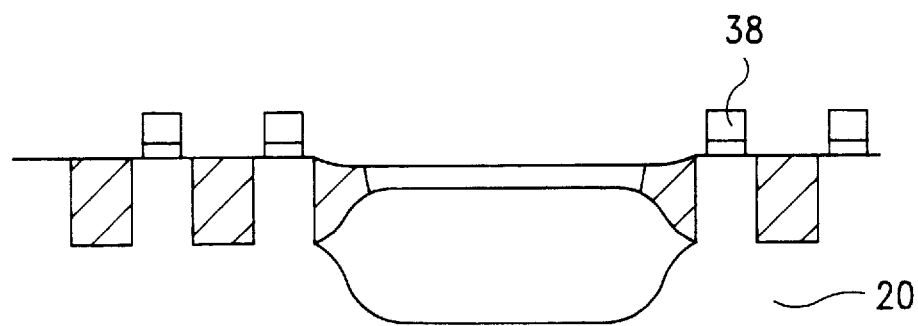

Before transistors are fabricated on the substrate 20 in the active areas 30, the dielectric layer 24 and the silicon oxide layer 22 are removed. First, the dielectric layer 24 is removed by a conventional wet or dry etch method, resulting in the structure shown in FIG. 8. Next, portion of the silicon oxide layer 32 and the silicon oxide layer 22 are removed, for example, by a conventional wet etch, resulting in the structure shown in FIG. 9. It is observed that a flat surface is obtained on the substrate 20 and the silicon oxide layer 32 because the etch rate of the silicon oxide layer 32 is larger than that of the silicon oxide layer 22. One or more conventional sacrificial oxide growth and removal steps may be applied over the structure of FIG. 9 in order to prepare a clean surface on the substrate 20 for fabricating transistors thereon. Thereafter, suitable processes are used to fabricate transistors 38 over the substrate 20 as shown in FIG. 10.

Although specific embodiments have been illustrated and described, it will be obvious to those skilled in the art that various modifications may be made without departing from the spirit which is intended to be limited solely by the appended claims.

What is claimed is:

1. A method of forming an isolation region in a semiconductor substrate, said method comprising:
   forming an insulating layer on the semiconductor substrate;
   forming a dielectric layer on said insulating layer;
   patterning to etch portions of said dielectric layer;
   etching said insulating layer and said semiconductor substrate using the patterned dielectric layer as a mask, thereby forming a trench in said semiconductor substrate;
   forming a first silicon oxide layer over the semiconductor substrate;
   anisotropically etching said first silicon oxide layer to form a spacer on the sidewall of the trench;
   thermally oxidizing said semiconductor substrate to form a field oxide region in said semiconductor substrate;
   forming a second silicon oxide layer over the field oxide region; and
   etching back said second silicon oxide layer until the surface of said dielectric layer is exposed.

2. The method according to claim 1, wherein said insulating layer comprises silicon oxide formed by thermal oxidation.

3. The method according to claim 1, wherein said dielectric layer comprises silicon nitride.

4. The method according to claim 1, wherein said dielectric layer comprises silicon oxide.

5. The method according to claim 1, wherein said first silicon oxide layer is formed by chemical vapor deposition.

6. The method according to claim 1, wherein said second silicon oxide layer is formed by chemical vapor deposition.

7. The method according to claim 1, wherein said step of etching back said second silicon oxide layer comprises the steps of:
   polishing a portion of said second silicon oxide layer to a predetermined height above said dielectric layer is reached; and
   etching said second silicon oxide layer until the surface of said dielectric layer is exposed.

8. The method according to claim 1, further comprising removing said dielectric layer.

9. The method according to claim 8, further comprising removing said insulating layer.

10. The method according to claim 9, further comprising the steps of:
    forming a sacrificial layer on said semiconductor substrate; and removing said sacrificial layer.

11. A method of forming an isolation region in a semiconductor substrate, said method comprising:
    forming an insulating layer on the semiconductor substrate;
    forming a dielectric layer on said insulating layer;
    patterning to etch portions of said dielectric layer;
    etching said insulating layer and said semiconductor substrate using the patterned dielectric layer as a mask, thereby forming a trench in said semiconductor substrate;
    forming a first silicon oxide layer over the semiconductor substrate;
    anisotropically etching said first silicon oxide layer to form a spacer on sidewall of the trench;
    thermally oxidizing said semiconductor substrate to form a field oxide region over said semiconductor substrate;
    forming a second silicon oxide layer over the field oxide region;
    polishing a portion of said second silicon oxide layer until a predetermined height of said second silicon oxide layer above said dielectric layer is reached;
    etching said second silicon oxide layer until surface of said dielectric layer is exposed;
    removing said dielectric layer;
    removing said insulating layer; and
    forming a sacrificial layer on said semiconductor substrate; and
    removing said sacrificial layer.

12. The method according to claim 11, wherein said insulating layer comprises silicon oxide formed by thermal oxidation.

13. The method according to claim 11, wherein said dielectric layer comprises silicon nitride.

14. The method according to claim 11, wherein said dielectric layer comprises silicon oxide.

15. The method according to claim 11, wherein said first silicon oxide layer is formed by chemical vapor deposition.

16. The method according to claim 11, wherein said second silicon oxide layer is formed by chemical vapor deposition.

* * * * *